(12) United States Patent
Hong et al.

(10) Patent No.: US 11,805,641 B2
(45) Date of Patent: Oct. 31, 2023

(54) SEMICONDUCTOR DEVICE MANUFACTURING METHOD

(71) Applicant: SAMSUNG ELECTRONICS CO., LTD., Suwon-si (KR)

(72) Inventors: Sa Hwan Hong, Suwon-si (KR); Jong Myeong Kim, Uiwang-si (KR); Myeong Jin Bang, Yongin-si (KR); Kong Soo Lee, Hwaseong-si (KR); Han Mei Choi, Seoul (KR); Ho Kyun An, Seoul (KR)

(73) Assignee: SAMSUNG ELECTRONICS CO., LTD.

( * ) Notice: Subject to any disclaimer, the term of this patent is extended or adjusted under 35 U.S.C. 154(b) by 123 days.

(21) Appl. No.: 17/568,499

(22) Filed: Jan. 4, 2022

(65) Prior Publication Data

US 2022/0336483 A1 Oct. 20, 2022

(30) Foreign Application Priority Data

Apr. 19, 2021 (KR) .................. 10-2021-0050448

(51) Int. Cl.
*H10B 41/20* (2023.01)
*H10B 41/60* (2023.01)

(52) U.S. Cl.
CPC ............. *H10B 41/20* (2023.02); *H10B 41/60* (2023.02)

(58) Field of Classification Search
CPC ... H01L 21/02123; H01L 24/82; H01L 25/18; H01L 28/88; H10B 12/03; H10B 12/0335; H10B 12/09; H10B 12/30; H10B 12/482; H10B 12/50; H10B 41/20; H10B 41/60

See application file for complete search history.

(56) References Cited

U.S. PATENT DOCUMENTS

| | | |
|---|---|---|
| 7,998,835 B2 | 8/2011 | Teo et al. |
| 9,607,990 B2 | 3/2017 | Cheng et al. |
| 9,871,140 B1 | 1/2018 | Balakrishnan et al. |
| 10,062,782 B2 | 8/2018 | Cheng et al. |
| 10,446,664 B1 | 10/2019 | Cheng et al. |
| 2020/0035820 A1* | 1/2020 | Zhang ............... H01L 29/78696 |
| 2020/0091287 A1 | 3/2020 | Glass et al. |
| 2020/0312981 A1 | 10/2020 | Bomberger et al. |

* cited by examiner

*Primary Examiner* — Mohammad M Hoque
*Assistant Examiner* — Kevin Quinto
(74) *Attorney, Agent, or Firm* — Myers Bigel, P.A.

(57) ABSTRACT

A method for manufacturing a semiconductor device is provided. The method for manufacturing a semiconductor device comprises providing a first substrate including a buffer layer and a base substrate, forming a stacked mold structure including a plurality of unit laminates on the buffer layer, each of the unit laminates including a first sacrificial layer, a first silicon layer, a second sacrificial layer, and a second silicon layer sequentially stacked in a vertical direction and replacing the stacked mold structure with a stacked memory structure through a replacement process, wherein the stacked memory structure includes a metal pattern which replaces the first sacrificial layer and the second sacrificial layer, and an insulating pattern which replaces the second silicon layer, the buffer layer includes silicon-germanium, and a germanium concentration of the buffer layer varies depending on the germanium concentration of the first sacrificial layer and the germanium concentration of the second sacrificial layer.

20 Claims, 15 Drawing Sheets

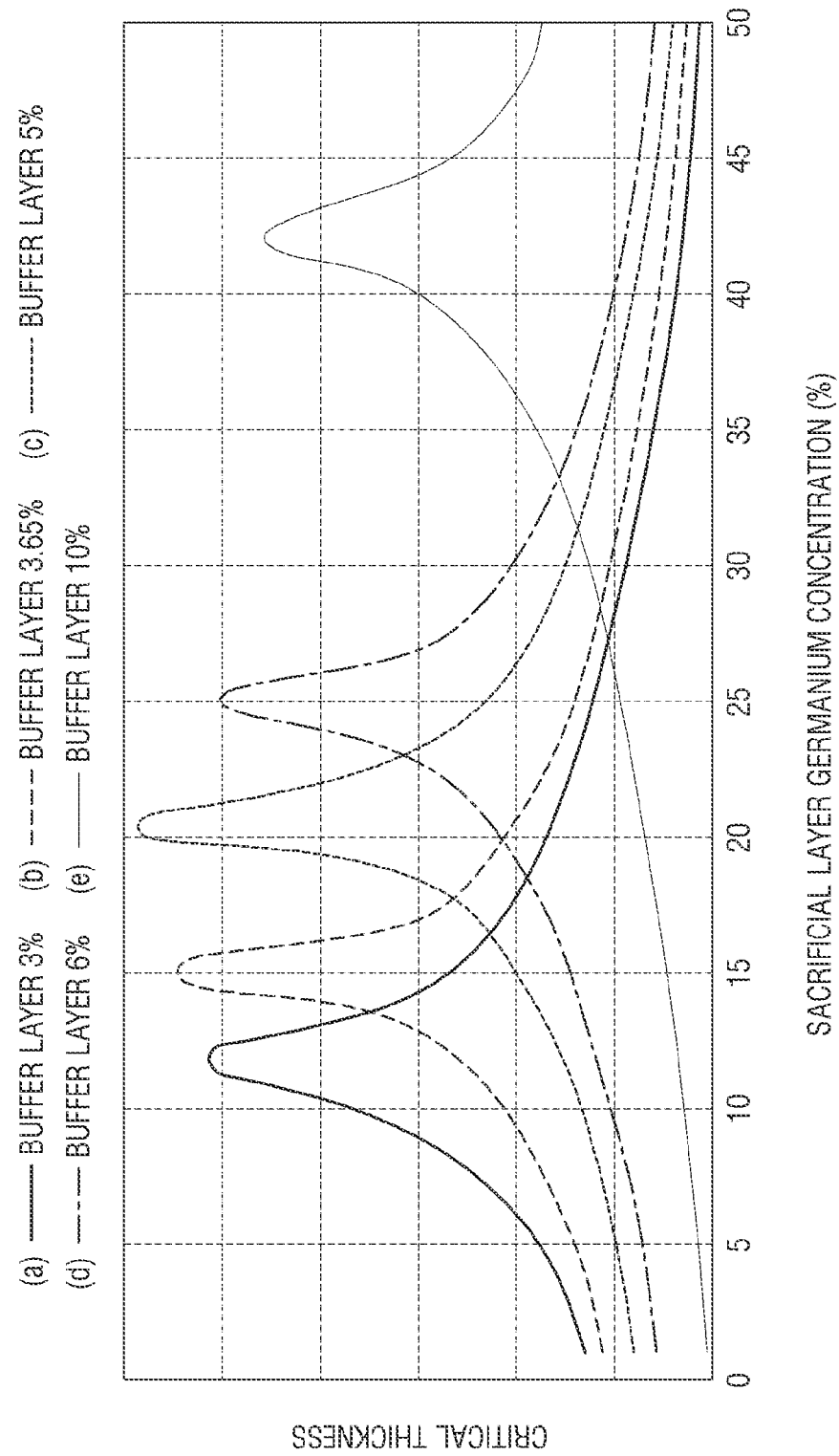

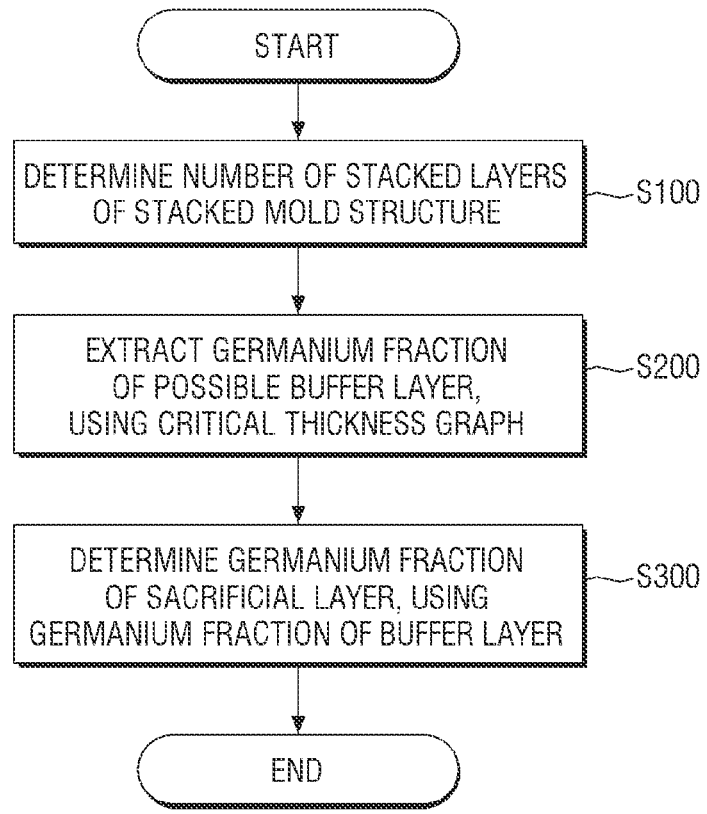

SEMICONDUCTOR DEVICE MANUFACTURING METHOD

CROSS-REFERENCE TO RELATED APPLICATION

This application claims priority from Korean Patent Application No. 10-2021-0050448 filed on Apr. 19, 2021 in the Korean Intellectual Property Office, and all the benefits accruing therefrom under 35 U.S.C. 119, the contents of which in its entirety are herein incorporated by reference.

BACKGROUND

1. Field of the Disclosure

The present disclosure relates to a method for manufacturing a semiconductor device, and more specifically, to a method for manufacturing a three-dimensional semiconductor device having improved electrical characteristics.

2. Description of the Related Art

In order to satisfy excellent performance and low price required by consumers, it may be required to increase the degree of integration of semiconductor elements. In the case of semiconductor elements, because the degree of integration is an important factor in determining the price of a product, an increased degree of integration is particularly required.

In the case of a conventional two-dimensional or planar semiconductor element, the degree of integration is mainly determined by an area occupied by unit memory cells, and is therefore greatly affected by the level of fine pattern forming technology. However, since ultra-expensive apparatuses are required for miniaturization of pattern, the degree of integration of two-dimensional semiconductor elements increases, but is still limited. Accordingly, three-dimensional semiconductor memory elements equipped with memory cells arranged three-dimensionally have been proposed.

SUMMARY

Aspects of the present disclosure provide a method for manufacturing a three-dimensional semiconductor device in which degree of integration is improved and electrical characteristics are improved.

According to some aspects of the present inventive concept, there is provided a method for manufacturing a semiconductor device comprising providing a first substrate including a buffer layer and a base substrate, forming a stacked mold structure including a plurality of unit laminates on the buffer layer, each of the unit laminates including a first sacrificial layer, a first silicon layer, a second sacrificial layer, and a second silicon layer sequentially stacked in a vertical direction and replacing the stacked mold structure with a stacked memory structure, wherein the stacked memory structure includes a metal pattern which replaces the first sacrificial layer and the second sacrificial layer, and an insulating pattern which replaces the second silicon layer, the buffer layer includes silicon-germanium, and a germanium fraction (i.e., concentration) of the buffer layer varies depending on the germanium concentration of the first sacrificial layer and the germanium concentration of the second sacrificial layer.

According to some aspects of the present inventive concept, there is provided a method for manufacturing a semiconductor device comprising providing a first substrate including a buffer layer and a base substrate, forming a stacked mold structure including a plurality of unit laminates on the buffer layer, each of the unit laminates including a first sacrificial layer, a first silicon layer, a second sacrificial layer, and a second silicon layer sequentially stacked in a vertical direction, replacing the stacked mold structure with a stacked memory structure through a replacement process, forming a peri or peripheral element structure on a second substrate and bonding the first substrate and the second substrate so that the peripheral element structure and the stacked memory structure face each other, wherein the buffer layer includes silicon-germanium, and a germanium concentration of the buffer layer varies depending on the germanium concentration of the first sacrificial layer and the germanium concentration of the second sacrificial layer.

According to some aspects of the present inventive concept, there is provided a method for manufacturing a semiconductor device comprising providing a first substrate including a buffer layer and a base substrate, and forming a stacked mold structure including a plurality of unit laminates on the buffer layer, wherein each of the unit laminates includes a first sacrificial layer, a first silicon layer, a second sacrificial layer, and a second silicon layer sequentially stacked in a vertical direction, the buffer layer, the first sacrificial layer and the second sacrificial layer each include silicon-germanium, determining the germanium concentration of the buffer layer by determining the number of stacked layers of the stacked mold structure, and extracting the germanium concentration of the buffer layer according to a thickness of the number of stacked layers, using a critical thickness graph, and determining the germanium concentration of the first sacrificial layer and the germanium concentration of the second sacrificial layer using the germanium concentration of the buffer layer.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

BRIEF DESCRIPTION OF THE DRAWINGS

The above and other aspects and features of the present disclosure will become more apparent by describing in detail exemplary embodiments thereof with reference to the attached drawings, in which:

FIG. 15 is a critical thickness graph for being referred to in the method for manufacturing the semiconductor device according to some embodiments.

FIG. 16 is a table for explaining a point where a critical thickness is greatest according to FIG. 15.

FIG. 17 is a flowchart for explaining a method for manufacturing a semiconductor device according to some embodiments.

DETAILED DESCRIPTION OF THE EMBODIMENTS

Figure 1:
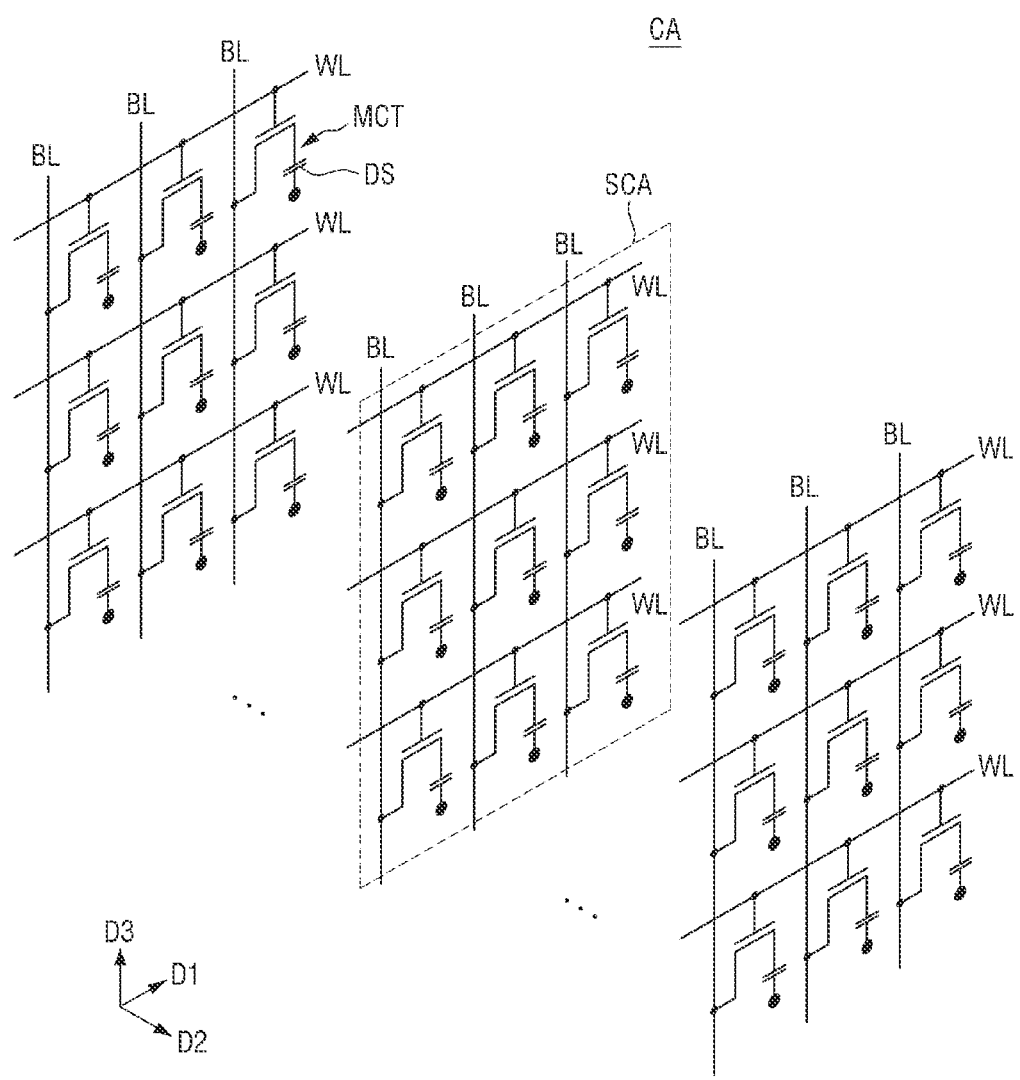
FIG. 1 is a schematic circuit diagram showing a cell array of a semiconductor device according to some embodiments.

Hereinafter, embodiments of the present disclosure will be described in detail referring to the accompanying drawings. The same reference numerals are used for the same components on the drawings, and repeated explanation thereof will not be provided.

Figure 2:
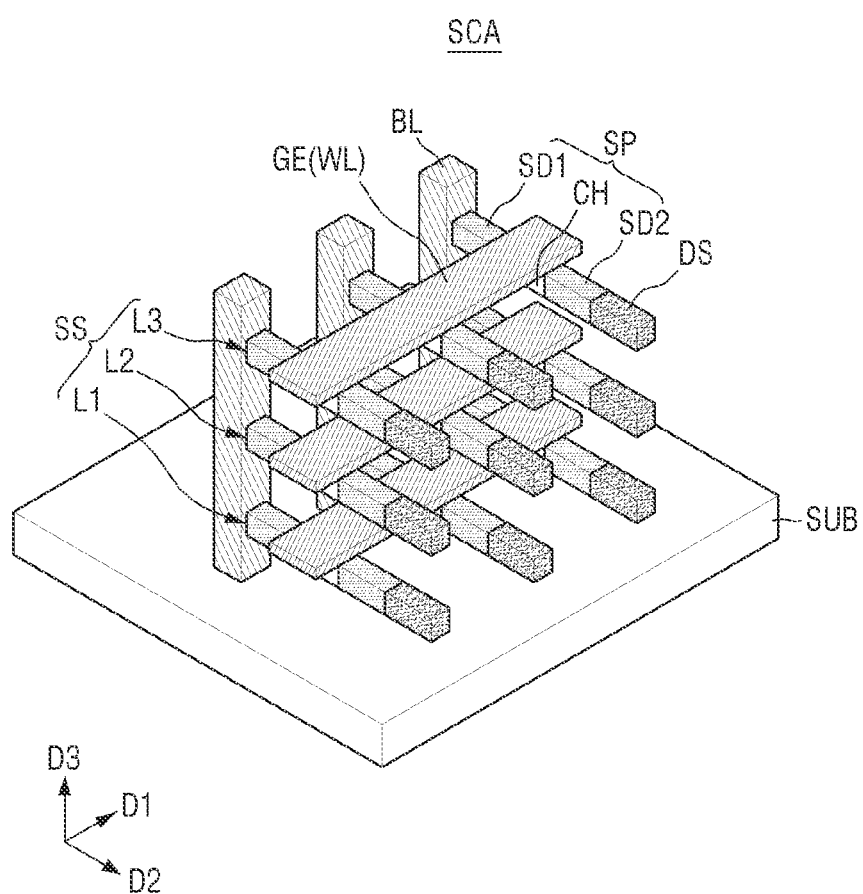
FIGS. 2 to 4 are perspective views for explaining the semiconductor device according to some embodiments.
Figure 3:
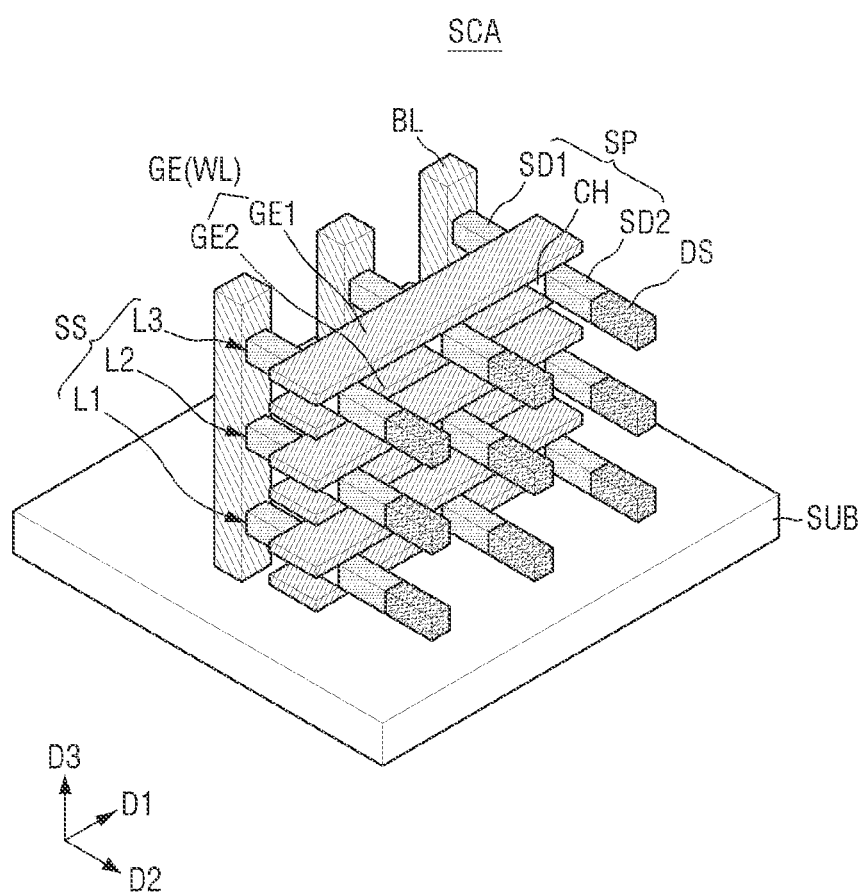
Figure 4:
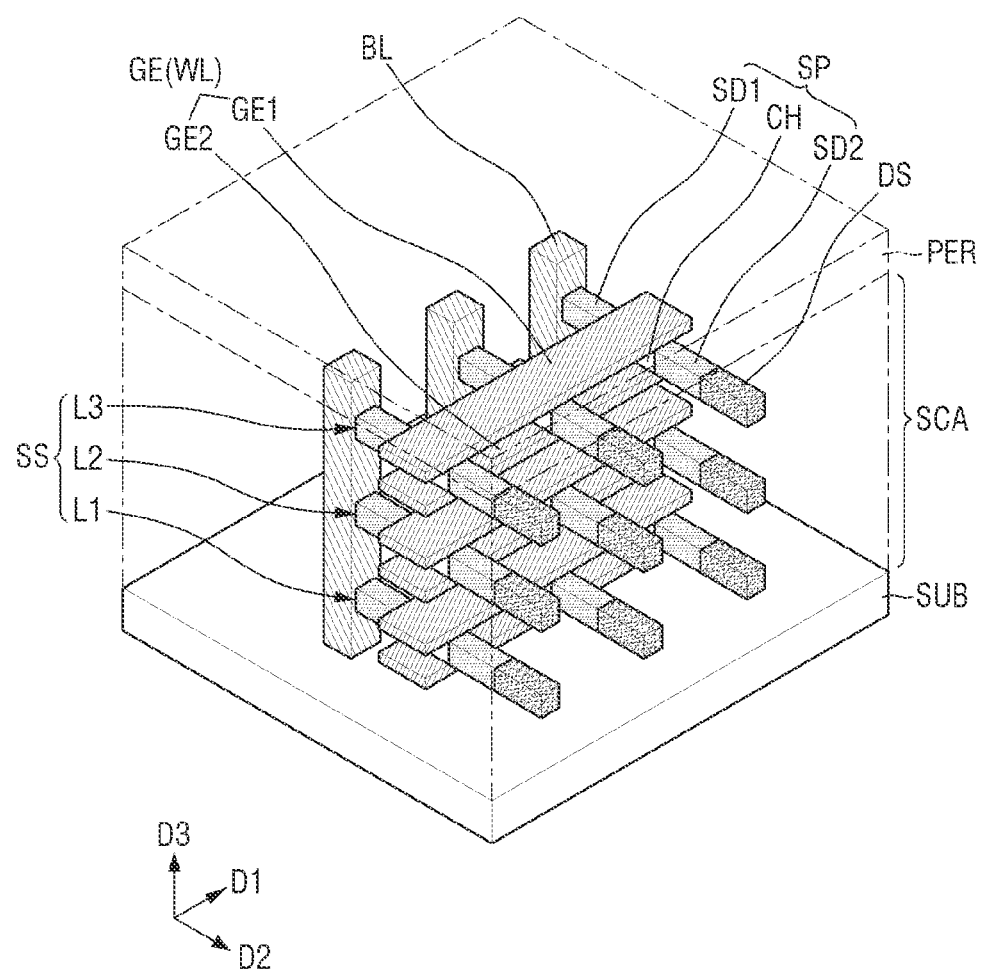

FIG. 1 is a schematic circuit diagram showing a cell array of a semiconductor device according to some embodiments. FIGS. 2 to 4 are perspective views for explaining the semiconductor device according to some embodiments.

Referring to FIG. 1, a cell array CA of the semiconductor device according to some embodiments may include a plurality of sub-cell arrays SCA. The sub-cell arrays SCA may be arranged along a second direction D2.

Each of the sub-cell arrays SCA may include a plurality of bit lines BL, a plurality of word lines WL, and a plurality of memory cell transistors MCT. A single memory cell transistor MCT may be placed between the single word line WL and the single bit line BL.

The bit lines BL may be conductive patterns (e.g., metallic conductive lines) extending in a perpendicular direction (i.e., a third direction D3) from a substrate. The bit lines BL in the single sub-cell array SCA may be arranged in a first direction D1. The bit lines BL adjacent to each other may be spaced apart from each other in the first direction D1.

For reference, the second direction D2 may intersect the first direction D1. The third direction D3 may intersect the first direction D1 and the second direction D2. As an example, the first direction D1, the second direction D2 and the third direction D3 may be, but are not limited to, perpendicular to each other. Further, the first direction D1 and the second direction D2 may be parallel to an upper surface of the substrate SUB (FIG. 2), and the third direction D3 may be perpendicular to the upper surface of the substrate SUB.

The word lines WL may be conductive patterns (e.g., metallic conductive lines) stacked on the substrate in the third direction D3. Each word line WL may extend in the first direction D1. The word lines BL adjacent to each other may be spaced apart from each other in the third direction D3.

A gate of the memory cell transistor MCT may be connected to the word line WL and a first source/drain of the memory cell transistor MCT may be connected to the bit line BL. A second source/drain of the memory cell transistor MCT may be connected to an information storage element DS. For example, the information storage element DS may be a capacitor. The second source/drain of the memory cell transistor MCT may be connected to a lower electrode of the capacitor.

Referring to FIGS. 1 and 2, one of the plurality of sub-cell arrays SCA explained using FIG. 1 may be placed on the substrate SUB.

The substrate SUB may be bulk silicon or SOI (silicon-on-insulator). In contrast, the substrate SUB may be a silicon substrate or may include other materials, but are not limited to, for example, silicon germanium, SGOI (silicon germanium on insulator), indium antimonide, lead tellurium compounds, indium arsenide, indium phosphide, gallium arsenide or gallium antimonide. In the following description, the substrate SUB will be described as a substrate including silicon.

A stacked structure SS including first to third layers L1, L2 and L3 may be placed on the substrate SUB. The first to third layers L1, L2 and L3 of the stacked structure SS may be stacked apart from each other in a direction perpendicular to the upper surface of the substrate SUB (that is, the third direction D3). Alternatively, the first to third layers L1, L2 and L3 of the stacked structure SS may be stacked apart from each other in a thickness direction (that is, the third direction D3) of the substrate SUB.

Each of the first to third layers L1, L2 and L3 may include a plurality of semiconductor patterns SP, a plurality of information storage elements DS, and a gate electrode GE.

The semiconductor pattern SP may have a line shape or a bar shape that extends in the second direction D2. The semiconductor pattern SP may include semiconductor materials such as silicon, germanium or silicon-germanium. As an example, the semiconductor pattern SP may include at least one of polysilicon, polysilicon germanium, single crystal silicon and single crystal silicon-germanium.

Each semiconductor pattern SP may include a channel region CH, a first impurity region SD1 and a second impurity region SD2. The channel region CH may be interposed between the first and second impurity regions SD1 and SD2. The channel region CH may correspond to a channel of the memory cell transistor MCT described referring to FIG. 1. The first and second impurity regions SD1 and SD2 may correspond to each of a first source/drain and a second source/drain of the memory cell transistor MCT described referring to FIG. 1.

The first and second impurity regions SD1 and SD2 are regions in which impurities are doped in the semiconductor pattern SP. Therefore, the first and second impurity regions SD1 and SD2 may have an n-type or p-type conductive type. The first impurity region SD1 may be formed adjacent to a first end of the semiconductor pattern SP, and the second impurity region SD2 may be formed adjacent to a second end of the semiconductor pattern SP1. The second end may be opposite to the first end in the second direction D2.

The first impurity region SD1 may be formed adjacent to the bit line BL. The first impurity region SD1 may be connected to the bit line BL. The second impurity region SD2 may be formed adjacent to the information storage element DS. The second impurity region SD2 may be connected to the information storage element DS.

The information storage element DS may be memory elements that may store data. Each information storage element DS may be a memory element using a capacitor, a memory element using a magnetic tunnel junction pattern, or a memory element using a variable resistor including a phase change material. As an example, each of the storage elements DS may be a capacitor.

The gate electrode GE may have a line shape or bar shape that extends in the first direction D1. The gate electrodes GE may be stacked apart from each other along the third direction D3. Each gate electrode GE may extend in the first direction D1 across the semiconductor pattern SP inside a single layer. That is to say, the gate electrode GE may be the horizontal word lines WL described referring to FIG. 1.

The gate electrode GE may include a conductive material. As an example, the gate electrode GE may include, but is not limited to, at least one of a doped semiconductor material (doped silicon, doped silicon-germanium, doped germanium, etc.), conductive metal nitride (titanium nitride, tantalum nitride, etc.), metal (tungsten, titanium, tantalum, etc.), and metal-semiconductor compound (tungsten silicide, cobalt silicide, titanium silicide, etc.).

A plurality of bit lines BL extending in the vertical direction (i.e., the third direction D3) may be provided on the substrate SUB. Each bit line BL may have a line shape or column shape that extends in the third direction D3. The bit lines BL may be arranged along the first direction D1. Each bit line BL may be electrically connected to the first impurity region SD1 of the vertically stacked semiconductor pattern SP.

The bit line BL may include a conductive material, and may include, but is not limited to, at least one of a doped semiconductor material, a conductive metal nitride, a metal, and a metal-semiconductor compound.

A first layer L1 among the first to third layers L1, L2 and L3 will be representatively described in detail. The semiconductor pattern SP of the first layer L1 may be arranged in the first direction D1. The semiconductor patterns SP of the first layer L1 may be located at the same level as each other. A gate electrode GE of the first layer L1 may extend in the first direction D1 across the semiconductor pattern SP of the first layer L1. For example, the gate electrode GE of the first layer L1 may be provided on the upper surface of the semiconductor pattern SP.

Although it is not shown, a gate insulating film may be interposed between the gate electrode GE and the channel region CH. The gate insulating film may include at least one of a high-dielectric constant insulating film, a silicon oxide film, a silicon nitride film, and a silicon oxynitride film. As an example, the high-dielectric constant insulating film may include, for example, one or more of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and lead zinc niobate.

Each bit line BL may be connected to the first end of the semiconductor pattern SP of the first layer L1. As an example, the bit line BL may be directly connected to the first impurity regions SD1. As another example, the bit line BL may be electrically connected to the first impurity region SD1 through the metal silicide. The specific explanation of the second layer L2 and the third layer L3 may be substantially the same as the aforementioned first layer L1.

Although it is not shown, empty spaces in the stacked structure SS may be filled with an insulating material. For example, the insulating material may include at least one of a silicon oxide film, a silicon nitride film, and a silicon oxynitride film. A wiring layer electrically connected to the sub-cell array SCA may be placed on the stacked structure SS.

Although it is not shown, a peripheral circuit which operates the sub-cell array SCA may be formed on the substrate SUB. The peripheral circuit and the sub-cell array may be connected, using the wiring layer.

Hereinafter, in the embodiments according to FIGS. 3 and 4, the detailed explanation of the repeated technical features of contents described above using FIGS. 1 and 2 will be omitted, and differences will be described in detail.

Referring to FIGS. 1 and 3, the gate electrodes GE may include a first gate electrode GE1 on an upper surface of the semiconductor pattern SP2, and a second gate electrode GE2 on a lower surface of the semiconductor pattern SP.

That is to say, in the semiconductor device according to some embodiments, the memory cell transistor may be a double gate transistor in which the gate electrodes GE are provided on both sides of the channel region CH.

Referring to FIGS. 1 and 4, a sub-cell array SCA may be placed on the substrate SUB. A peripheral circuit region PER may be placed on the sub-cell array SCA.

The peripheral circuit region PER may include peripheral circuit transistors formed on the substrate SUB. The peripheral circuit region PER may include a circuit for operating the three-dimensional semiconductor memory devices according to some embodiments.

As an example, the peripheral circuit region PER may be electrically connected to the sub-circuit array SCA, for example, through a penetration contact.

As another example, the peripheral circuit region PER may include a peripheral circuit wiring layer that is electrically connected to a circuit for operating the sub-circuit array SCA. The wiring layer electrically connected to the sub-cell array SCA may be placed to face the peripheral circuit wiring layer of the peripheral circuit region PER. The wiring layer electrically connected to the sub-cell array SCA may be electrically connected to the peripheral circuit wiring layer of the peripheral circuit region PER, using a wafer bonding method.

Figure 12:
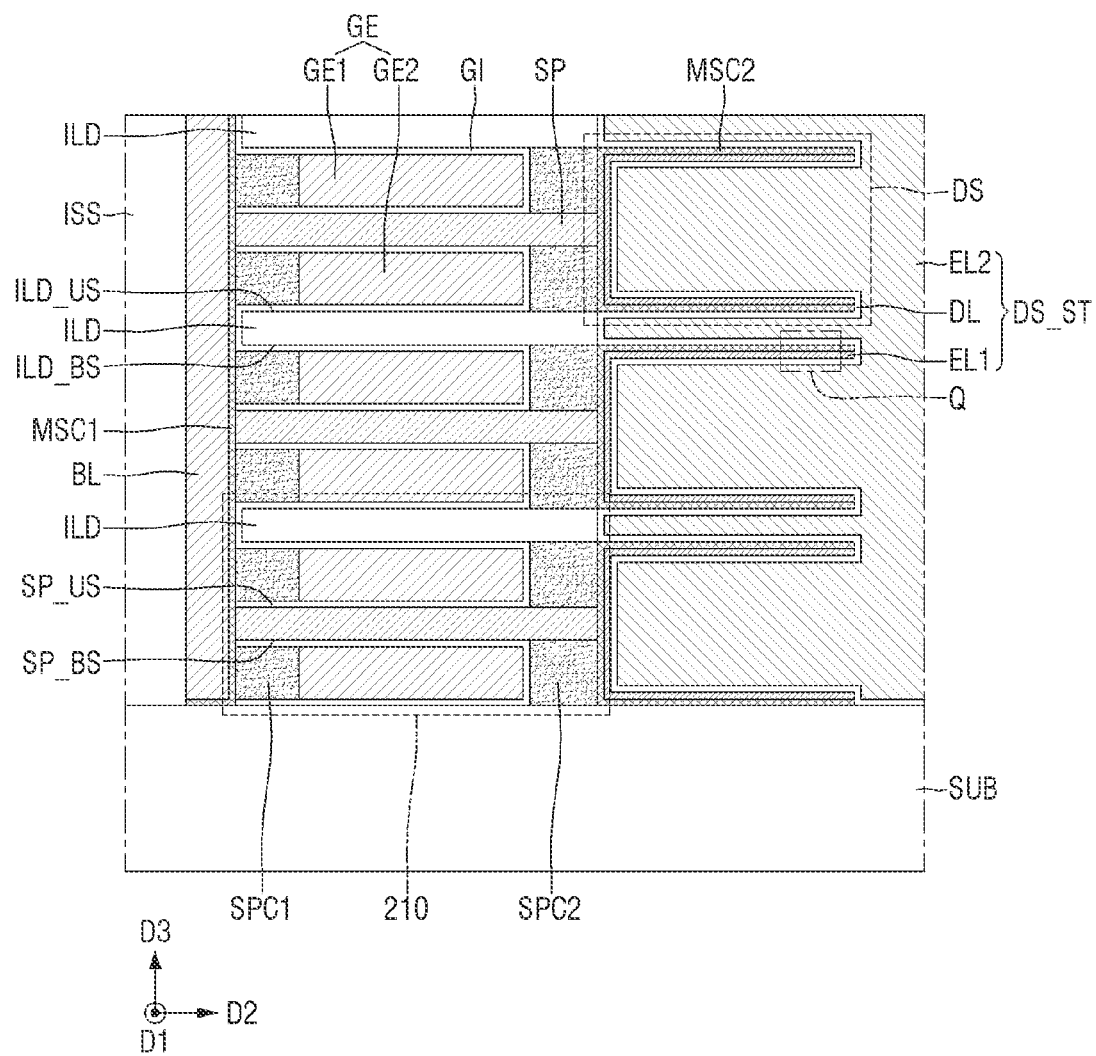
FIG. 12 is a diagram for explaining a semiconductor device according to some embodiments.
Figure 13:
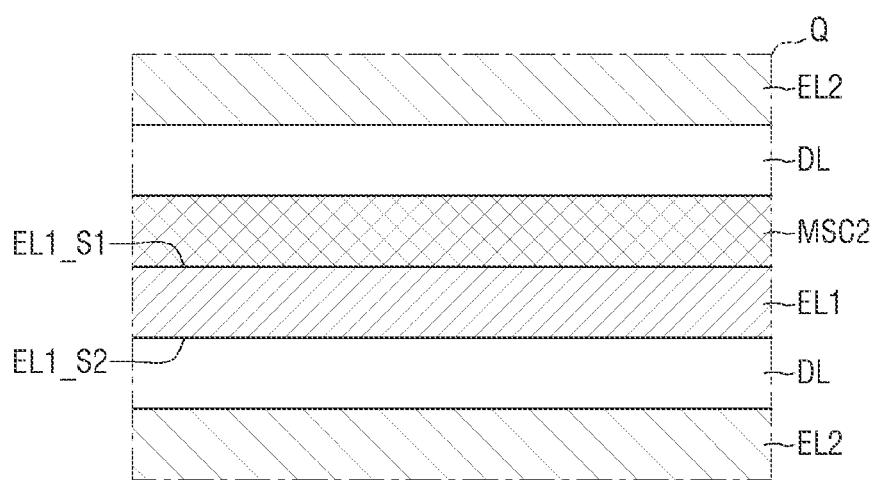
FIG. 13 is an enlarged view of a portion Q of FIG. 12.
Figure 14:
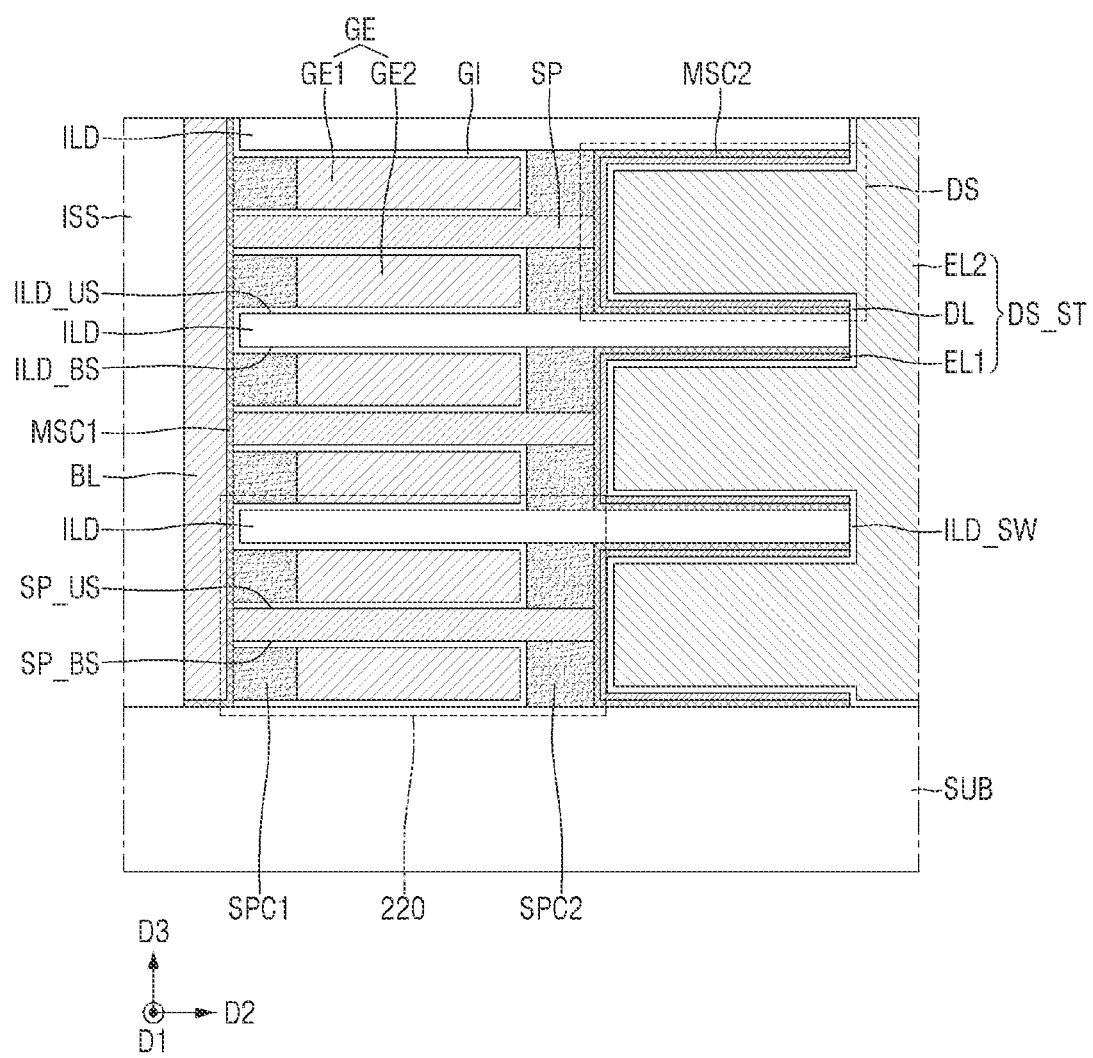
FIG. 14 is a diagram for explaining a semiconductor device according to some embodiments.

FIGS. 5 to 11 are diagrams for explaining a method for manufacturing the semiconductor device according to some embodiments, respectively. FIG. 12 is a diagram for explaining a semiconductor device according to some embodiments. FIG. 13 is an enlarged view of a portion Q of FIG. 12. FIG. 14 is a diagram for explaining a semiconductor device according to some embodiments.

Figure 5:
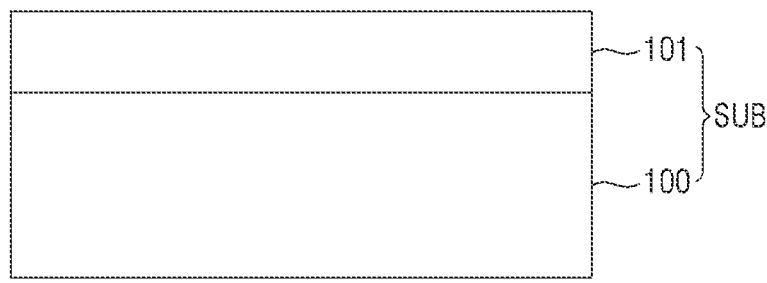
FIGS. 5 to 11 are diagrams for explaining a method for manufacturing the semiconductor device according to some embodiments, respectively.
Figure 6:
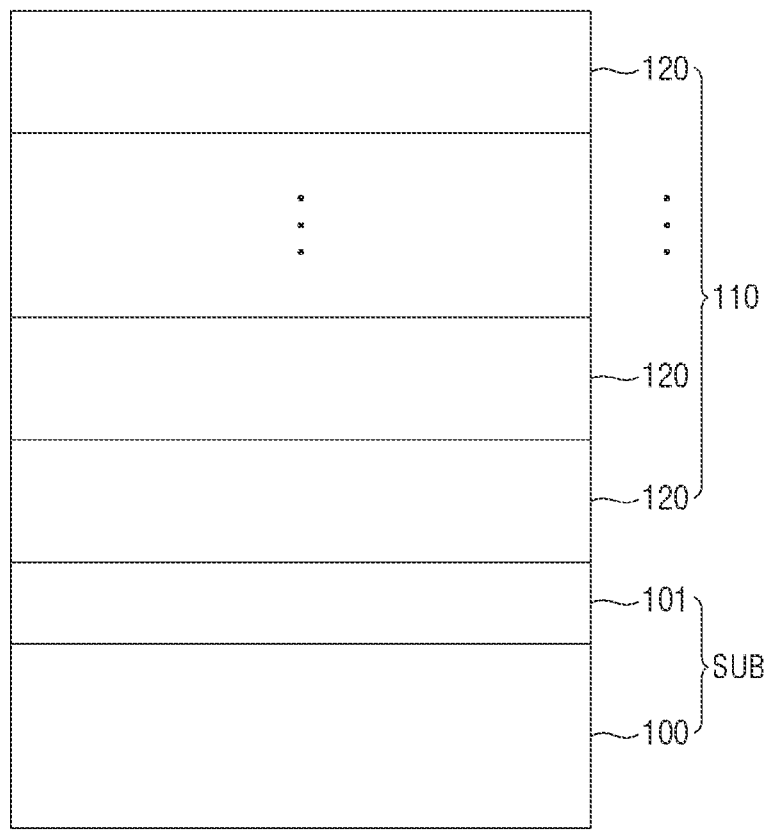
Figure 7:
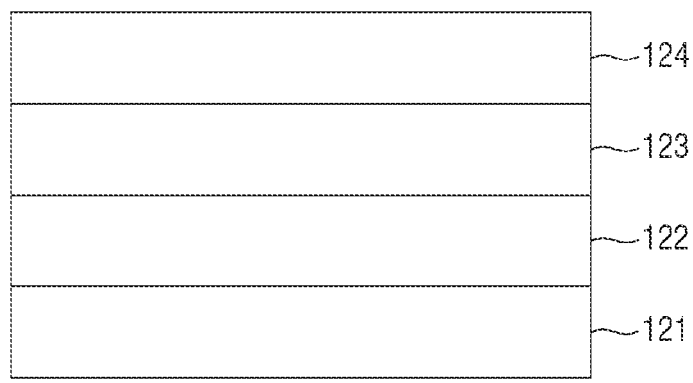
Figure 8:
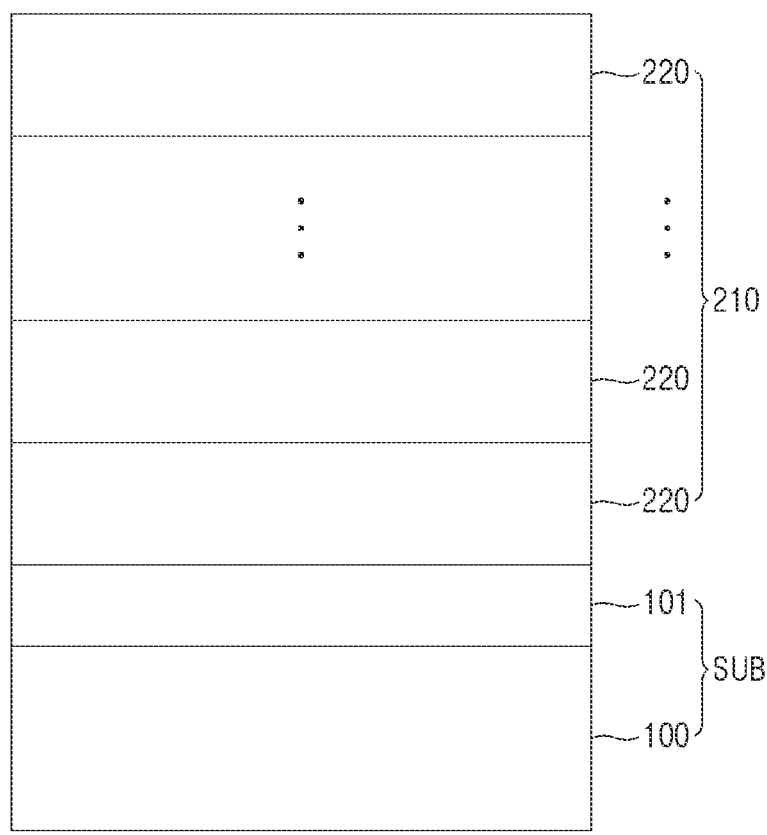
Figure 9:
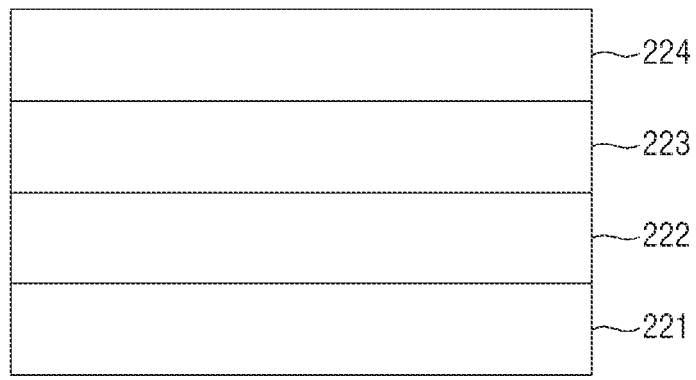

A substrate SUB may be provided referring to FIGS. 5 to 7.

The substrate SUB may include a base substrate 100 and a buffer layer 101. The buffer layer 101 may be placed on the base substrate 100.

The buffer layer 101 may include silicon-germanium (SiGe). A germanium fraction or concentration of the buffer layer 101 may be 3% or more and 10% or less. The germanium fraction or concentration of the buffer layer 101 may vary depending on the germanium fraction or concentration of the sacrificial layers 121 and 123. The specific selection of the germanium fraction or concentration of the buffer layer 101 will be provided below referring to FIGS. 15 to 17.

A stacked mold structure 110 may be formed on the buffer layer 101. The stacked mold structure 110 may include a plurality of unit laminates 120.

The plurality of unit laminates 120 may be repeatedly stacked in the third direction D3 perpendicular to the upper surface of the substrate SUB. For example, the thickness of the stacked mold structure 110 may be 7 μm or more and 76 μm from the upper surface of the substrate SUB. However, this is only an example, and the technical idea of the present disclosure is not limited thereto.

One unit laminate 120 may include a first sacrificial layer 121, a first silicon layer 122, a second sacrificial layer 123, and a second silicon layer 124.

The first sacrificial layer 121, the first silicon layer 122, the second sacrificial layer 123 and the second silicon layer 124 may be sequentially stacked in the third direction D3. The first sacrificial layer 121 and the second sacrificial layer 123 may be spaced apart from each other along the third direction D3. The first silicon layer 122 and the second silicon layer 124 may be spaced apart from each other along the third direction.

The first sacrificial layer 121 and the second sacrificial layer 123 may include silicon-germanium (SiGe). The first silicon layer 122 and the second silicon layer 124 may include silicon (Si).

The germanium fraction or concentration of the first sacrificial layer 121 may be the same as the germanium fraction or concentration of the second sacrificial layer 123.

The germanium fractions or concentrations of the first sacrificial layer 121 and the second sacrificial layer 123 may be 10% or more and 45% or less, respectively. Specific selection of the germanium fractions or concentrations of the first sacrificial layer 121 and the second sacrificial layer 123 will be described below referring to FIGS. 15 to 17.

Referring to FIGS. 6 to 9, the method for manufacturing a semiconductor device according to some embodiments may include replacement of the stacked mold structure 110 for a stacked memory structure 210 through a replacement process.

The stacked memory structure 210 may include a plurality of unit memory structures 220. The unit memory structure 220 may include metal patterns 221 and 223, a first silicon layer 222, and an insulating pattern 224.

The metal patterns 221 and 223 may replace the first sacrificial layer 121 and the second sacrificial layer 123. The metal patterns 221 and 223 may correspond to the gate electrode GE of FIG. 12.

The insulating pattern 224 may replace the second silicon layer 124. The insulating pattern 224 may correspond to the interlayer insulating film ILD of FIG. 12.

In FIG. 7, the first silicon layer 122 may not be removed during the replacement process. That is, the first silicon layer 122 of FIG. 7 may be the same as the first silicon layer 222 of FIG. 9. The first silicon layer 222 may correspond to the semiconductor pattern SP of FIG. 12.

Figure 10:
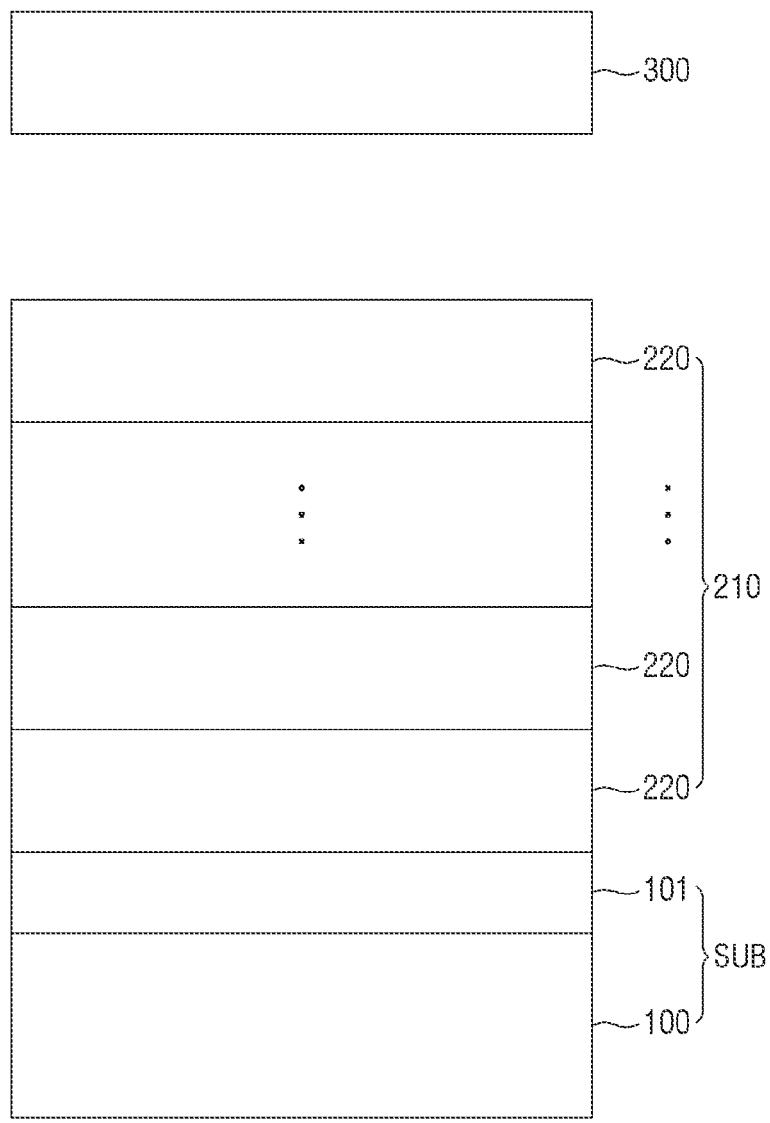
Figure 11:
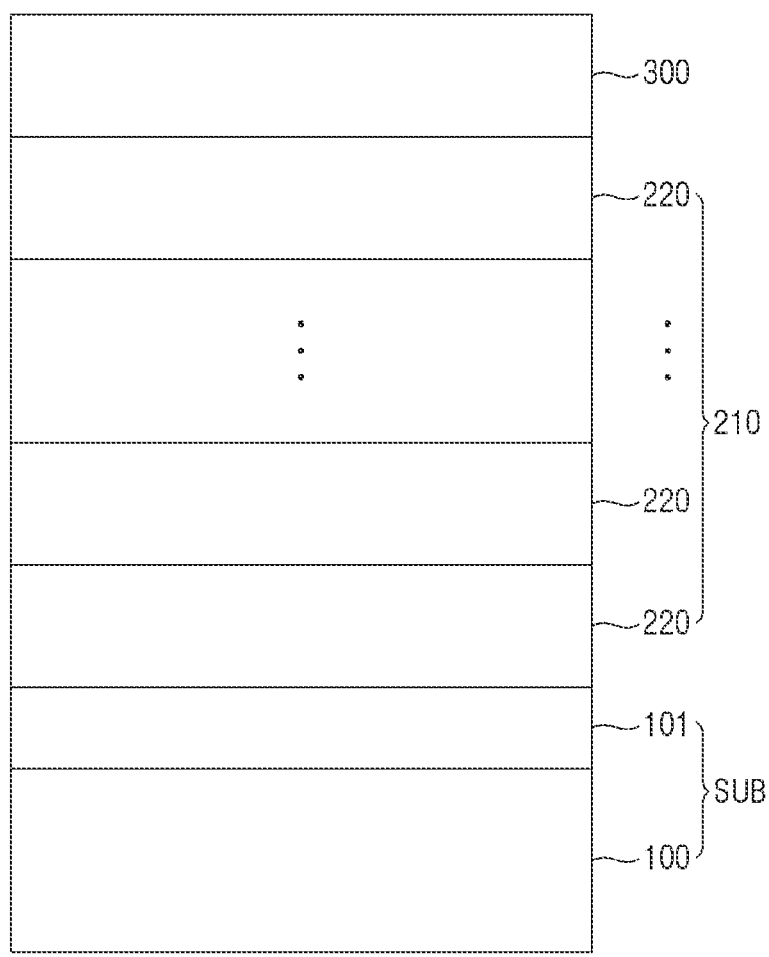

Referring to FIGS. 10 and 11, the method for manufacturing the semiconductor device according to some embodiments may include bonding of the first substrate SUB and the second substrate 300.

Although it is not shown, a peripheral element structure may be formed on the second substrate 300. For bonding, the second substrate 300 may be placed to face the first substrate SUB. After that, the first substrate SUB and the second substrate 300 may be bonded so that the peripheral element structure and the stacked memory structure face each other.

Although it is not shown, a process of removing the base substrate 100 and the buffer layer 101 may then be performed. However, this is only an example, and the technical idea of the present disclosure is not limited thereto. For example, the base substrate 100 and the buffer layer 101 may not be removed.

For reference, FIG. 12 may be an exemplary cross-sectional view of a portion of the semiconductor pattern SP stacked in the third direction D3 in FIG. 3 is cut along the second direction D2.

For convenience of explanation, repeated parts of contents explained using FIGS. 1 to 4 will be briefly described, and the differences will be mainly described.

Referring to FIG. 12, the semiconductor device according to some embodiments may include a bit line BL, a stacked memory structure 210, and an information storage element structure DS_ST.

The bit line BL may be conductive patterns (e.g., metal conductive lines) extending in a vertical direction (i.e., the third direction D3) from the substrate SUB.

An isolation insulating structure ISS may be placed on the substrate SUB. The isolation insulating structure ISS may spatially separate the bit lines BL adjacent to each other in the second direction D2. The isolation insulating structure ISS may include, for example, an insulating material.

The stacked memory structure 210 may include an interlayer insulating film ILD, a semiconductor pattern SP, and a gate electrode GE.

A plurality of interlayer insulating films ILD may be placed on the substrate SUB. The respective interlayer insulating films ILD may be placed apart from each other in the third direction D3. Although the three interlayer insulating films ILD are shown, this is only for convenience of explanation, and the number thereof is not limited thereto.

Each interlayer insulating film ILD may include an upper surface ILD_US and a lower surface ILD_BS opposite to each other in the third direction D3. The plurality of interlayer insulating films ILD may include a first interlayer insulating film ILD and a second interlayer insulating film ILD adjacent to each other in the third direction D3. The first interlayer insulating film ILD may be closer to the substrate SUB than the second interlayer insulating film ILD. The upper surface ILD_US of the first interlayer insulating film may face the lower surface ILD_BS of the second interlayer insulating film.

The interlayer insulating film ILD may include an insulating material. The interlayer insulating film ILD may include, for example, at least one of a silicon oxide film, a silicon nitride film, a silicon oxide nitride film, a carbon-containing silicon oxide film, a carbon-containing silicon nitride film, and a carbon-containing silicon oxide nitride film. As an example, the interlayer insulating film ILD may include a silicon oxide film.

Although a structure is shown in which the interlayer insulating film ILD located at the lowermost part is spaced apart from the substrate SUB, and the semiconductor pattern SP and the gate electrode GE are placed between the interlayer insulating film ILD and the substrate SUB, the embodiment is not limited thereto. As an example, unlike the shown embodiment, the interlayer insulating film ILD located at the lowermost part may be in contact with the substrate SUB. As another example, an etching stop film placed along the upper surface of the substrate SUB may be further placed between the gate electrode GE placed at the lowermost part and the substrate SUB.

The plurality of semiconductor patterns SP may be placed between the interlayer insulating films ILD adjacent to each other in the third direction D3. Each semiconductor pattern SP may be spaced apart from each other in the third direction D3.

In other words, the plurality of semiconductor patterns SP may be placed on the substrate SUB to be spaced apart from each other in the third direction D3. The interlayer insulating film ILD may be placed between the semiconductor patterns SP adjacent to each other in the third direction D3. Although the interlayer insulating film ILD may not be placed between the semiconductor pattern SP located at the lowermost part and the substrate SUB, this is only for convenience of explanation, and the embodiment is not limited thereto.

Each semiconductor pattern SP may extend in the second direction D2. Each semiconductor pattern SP may overlap the upper surface ILD_US of the interlayer insulating film and the lower surface ILD_BS of the interlayer insulating film that face each other in the third direction D3.

The semiconductor pattern SP may include at least one of polysilicon, polysilicon germanium, single crystal silicon and single crystal silicon-germanium.

The gate electrode GE may have a line shape or bar shape that extends in the first direction D1. The gate electrode GE may extend in the first direction D1 across the semiconductor pattern SP inside one layer.

Specifically, the gate electrode GE may include a first gate electrode GE1 and a second gate electrode GE2. The first gate electrode GE1 may be a metal pattern that replaces the second sacrificial layer 123. The second gate electrode GE2 may be a metal pattern that replaces the first sacrificial layer 121.

However, this is merely a difference in appellation, and the technical idea of the present disclosure is not limited thereto. For example, the first gate electrode GE1 may be a metal pattern that replaces the first sacrificial layer 121, and the second gate electrode GE2 may be a metal pattern that replaces the second sacrificial layer 123.

In the semiconductor device according to some embodiments of the present disclosure, the stacked memory structure 210 may further include a gate insulating film GI and spacer patterns SPC1 and SPC2.

The gate insulating film GI may be placed between the first gate electrode GE1 and the semiconductor pattern SP, and between the first gate electrode GE1 and the interlayer insulating film ILD. The gate insulating film GI may be placed between the second gate electrode GE2 and the semiconductor pattern SP, and between the second gate electrode GE2 and the interlayer insulating film ILD.

The gate insulating film GI may be placed on the side walls of the first gate electrode GE1 which is adjacent to the information storage element structure DS_ST and extends in the third direction D3. The gate insulating film GI may be placed on the side walls of the second gate electrode GE2 which is adjacent to the information storage element structure DS_ST and extends in the third direction D3. Further, the gate insulating film GI may be placed, but is not limited to, on the side walls that connect the upper surface ILD_US of the interlayer insulating film and the lower surface ILD_BS of the interlayer insulating film.

The gate insulating film GI may include, for example, at least one of a high-dielectric constant insulating film, a silicon oxide film, a silicon nitride film, and a silicon oxide nitride film.

A spacer pattern may include a first spacer pattern SPC1 and a second spacer pattern SPC2.

The first spacer pattern SPC1 may be placed between the semiconductor pattern SP and the interlayer insulating film ILD. The first spacer pattern SPC1 may be placed on an upper surface SP_US of the semiconductor pattern and a lower surface SP_BS of the semiconductor pattern.

The first spacer pattern SPC1 may spatially separate the gate electrode GE and the bit line BL. The gate insulating film GI may be interposed between the first spacer pattern SPC1 and the semiconductor pattern SP, and between the first spacer pattern SPC1 and the interlayer insulating film ILD. Unlike the shown embodiment, the gate insulating film GI may not be interposed between the first spacer pattern SPC1 and the semiconductor pattern SP, and between the first spacer pattern SPC1 and the interlayer insulating film ILD.

The second spacer pattern SPC2 may be placed between the semiconductor pattern SP and the interlayer insulating film ILD. The second spacer pattern SPC2 may be placed on an upper surface SP_US of the semiconductor pattern and a lower surface SP_BS of a horizontal portion of the semiconductor pattern.

The second spacer pattern SPC2 may be interposed between the gate electrode GE and the information storage element structure DS_ST.

The gate insulating film GI may not be interposed between the second spacer pattern SPC2 and the semiconductor pattern SP, and between the second spacer pattern SPC2 and the interlayer insulating film ILD.

The first spacer pattern SPC1 and the second spacer pattern SPC2 may each include, for example, at least one of silicon oxide film, silicon nitride film, silicon oxide nitride film, carbon-containing silicon oxide film, carbon-containing silicon nitride film, and carbon-containing silicon oxide nitride film.

A first silicide pattern MSC1 may be placed between the bit line BL and the semiconductor pattern SP. The first silicide pattern MSC1 may extend along the semiconductor pattern SP, the side walls of the first spacer pattern SPC1, and the side walls of the interlayer insulating film ILD.

The first silicide pattern MSC1 may be in contact with a plurality of semiconductor patterns SP. The first silicide pattern MSC1 may be in contact with a plurality of semiconductor patterns SP spaced apart from each other in the third direction D3.

A second silicide pattern MSC2 may be placed on the side walls of the semiconductor pattern SP. The second silicide pattern MSC2 may extend along the side walls of the semiconductor pattern SP, the interlayer insulating film ILD, and the second spacer pattern SPC2.

The second silicide pattern MSC2 may be in contact with a plurality of semiconductor patterns SP. The second silicide pattern MSC2 may be in contact with a plurality of semiconductor patterns SP spaced apart from each other in the third direction D3.

The second silicide pattern MSC2 may also extend in the second direction D2. The second silicide pattern MSC2 may extend alongside the upper surface ILD_US and the lower surface ILD_BS of the interlayer insulating film.

The information storage element structure DS_ST may include a plurality of information storage elements DS. Each information storage element DS may be placed in the second direction D2 from the side wall of the second spacer pattern SPC2.

Each information storage element DS may be connected to each semiconductor pattern SP. Each information storage element DS may be connected to each second silicide pattern MSC2. The second silicide pattern MSC2 may be placed along the boundary between the information storage element DS and the side wall of the semiconductor pattern SP.

The first silicide pattern MSC1 and the second silicide pattern MSC2 may include a silicidizing material of metal (a metal-silicon compound) or a silicidizing material of metal nitride (a metal nitride-silicon compound). The first silicide pattern MSC1 and the second silicide pattern MSC2 may include, but are not limited to, for example, a silicide material including one of titanium (Ti), niobium (Nb), molybdenum (Mo), tungsten (W), cobalt (Co), platinum (Pt) and erbium (Er).

Each information storage element DS may be a capacitor. An information storage element structure DS_ST including a plurality of information storage elements DS may be a capacitor structure.

The information storage element structure DS_ST may include a capacitor dielectric film DL, an upper electrode EL2, and a plurality of lower electrodes EL1. Each information storage element DS may include a lower electrode EL1, a capacitor dielectric film DL, and an upper electrode EL2 placed between the interlayer insulating films ILD. Each information storage element DS may be defined by each lower electrode EL1.

Each lower electrode EL1 may be placed between the interlayer insulating films ILD adjacent to each other in the third direction D3. The lower electrode EL1 may be connected to the second silicide pattern MSC2. The lower electrode EL1 may be in contact with the second silicide pattern MSC2.

In the semiconductor memory device according to some embodiments, each lower electrode EL1 may extend along the profile of each second silicide pattern MSC2. In other words, each second silicide pattern MSC2 may extend along the profile of each lower electrode EL1.

The lower electrode EL1 included in each information storage element DS may be separated from each other.

The capacitor dielectric film DL1 may be placed on the lower electrode EL1. The capacitor dielectric film DL1 may extend along the profiles of a plurality of lower electrodes EL1. The upper electrode EL2 may be placed on the capacitor dielectric film DL. The capacitor dielectric film DL and the upper electrode EL2 may be sequentially placed on the lower electrode EL1.

The capacitor dielectric film DL and the upper electrode EL2 included in each information storage element DS may be connected to each other.

The lower electrode EL1 and the upper electrode EL2 may include, but are not limited to, for example, a doped semiconductor material, a conductive metal nitride (e.g., titanium nitride, tantalum nitride, niobium nitride or tungsten nitride, etc.), a metal (e.g., ruthenium, iridium, titanium, niobium, tungsten, cobalt, molybdenum or tantalum etc.), and a conductive metal oxide (e.g., iridium oxide or niobium oxide) and the like. As an example, the lower electrode EL1 may include a conductive metal nitride, a metal, a conductive metal oxide. The conductive metal nitride, metal, and conductive metal oxide may be included in the metallic conductive film.

The capacitor dielectric film DL may include, for example, a high-dielectric constant material (e.g., hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, lead zinc niobate or combinations thereof). In the semiconductor memory device according to some embodiments, the capacitor dielectric film DL may include a stacked film structure in which zirconium oxide, aluminum oxide and zirconium oxide are sequentially stacked. In the semiconductor memory device according to some embodiments, the capacitor dielectric film DL may include hafnium (Hf).

Referring to FIGS. 12 and 13, in the semiconductor memory device according to some embodiments, each lower electrode EL1 may include an outer wall EL1_S1 and an inner wall EL1_S2.

The outer wall EL1_S1 of the lower electrode may face the second silicide pattern MSC2. Further, the lower electrode EL1 may be connected to the semiconductor pattern SP through the outer wall EL1_S1 of the lower electrode.

The capacitor dielectric film DL may extend along the outer wall EL1_S1 of the lower electrode and the inner wall EL1_S2 of the lower electrode.

Hereinafter, differences from those described using FIGS. 12 and 13 will be mainly described in FIG. 14.

Referring to FIG. 14, in the semiconductor device according to some embodiments, each semiconductor pattern SP may overlap a part of the upper surface ILD_US of the interlayer insulating film and a part of the lower surface ILD_BS of the interlayer insulating film that face each other, in the third direction D3. In other words, the interlayer insulating film ILD may protrude from the semiconductor pattern SP in the second direction D2.

A plurality of second silicide patterns MSC2 may be placed between the interlayer insulating films ILD. Each second silicide pattern MSC2 may be in contact with each semiconductor pattern SP. The second silicide pattern MSC2 may extend along the side walls of the semiconductor pattern SP and the second spacer pattern SPC2.

In the semiconductor memory device according to some embodiments, the second silicide pattern MSC2 may include a portion that extends in the second direction D2 along the upper surface ILD_US of the interlayer insulating film and the lower surface ILD_BS of the interlayer insulating film. A part of the second silicide pattern MSC2 may include a portion extending along the side wall SPC_SW of the second spacer pattern.

In the semiconductor memory device according to some embodiments, each information storage element DS may be placed between the interlayer insulating films ILD protruding from the semiconductor pattern SP in the second direction D2. When a plurality of interlayer insulating films ILD include a first interlayer insulating film ILD and a second interlayer insulating film ILD adjacent to each other in the third direction D3, each information storage element DS may be placed between the first interlayer insulating film ILD and the second interlayer insulating film ILD in the second direction D2 from the semiconductor pattern SP.

The lower electrodes EL1 adjacent to each other in the third direction D3 may be separated by the interlayer insulating film ILD. The second silicide patterns MSC2 adjacent to each other in the third direction D3 may be separated by the interlayer insulating film ILD.

Because the outer wall EL1_S1 of the lower electrode is covered with the interlayer insulating film ILD, the capacitor dielectric film DL does not extend along the outer wall EL1_S1 of the lower electrode. The capacitor dielectric film DL may extend along one side wall ILD_SW of the interlayer insulating film. The capacitor dielectric films DL may not be separated by the adjacent interlayer insulating film ILD.

FIG. 15 is a critical thickness graph for being referred to in the method for manufacturing the semiconductor device according to some embodiments. FIG. 16 is a table for explaining a point where a critical thickness is greatest according to FIG. 15. FIG. 17 is a flowchart for explaining a method for manufacturing a semiconductor device according to some embodiments.

For reference, FIG. 15 is a graph for determining the critical thickness of the stacked memory structure 210 depending on the germanium concentrations of the buffer layer 101 and the sacrificial layers 121 and 123.

Referring to FIGS. 15 and 16, when the germanium concentration of the buffer layer 101 is 3%, a critical thickness graph (a) of the stacked memory structure 210 according to the germanium concentration of the sacrificial layers 121 and 123 is shown. The critical thickness graph (a) may mean that the critical thickness of the stacked memory structure 210 is the thickest, when the germanium concentration of the sacrificial layers 121 and 123 is about 12%.

When the germanium concentration of the buffer layer 101 is 3.65%, a critical thickness graph (b) of the stacked memory structure 210 according to the germanium concentration of the sacrificial layers 121 and 123 is shown. The critical thickness graph (a) may mean that the critical thickness of the stacked memory structure 210 is the thickest when the germanium concentration of the sacrificial layers 121 and 123 is about 15%.

When the germanium concentration of the buffer layer 101 is 5%, a critical thickness graph (c) of the stacked memory structure 210 according to the germanium concentration of the sacrificial layers 121 and 123 is shown. The critical thickness graph (a) may mean that the critical thickness of the stacked memory structure 210 is the thickest when the germanium concentration of the sacrificial layers 121 and 123 is about 20%.

When the germanium concentration of the buffer layer 101 is 6%, a critical thickness graph (d) of the stacked memory structure 210 according to the germanium concentration of the sacrificial layers 121 and 123 is shown. The critical thickness graph (a) may mean that the critical thickness of the stacked memory structure 210 is the thickest when the germanium concentration of the sacrificial layers 121 and 123 is about 25%.

When the germanium concentration of the buffer layer 101 is 10%, a critical thickness graph (e) of the stacked memory structure 210 according to the germanium concentration of the sacrificial layers 121 and 123 is shown. The critical thickness graph (a) may mean that the critical thickness of the stacked memory structure 210 is the thickest when the germanium concentration of the sacrificial layers 121 and 123 is about 42%.

Referring to FIG. 17, the method for manufacturing a semiconductor device according to some embodiments may include determination of the germanium concentration of the buffer layer 101, and determination of the germanium concentration of the first sacrificial layer 121 and the second sacrificial layer 123.

Determination of the germanium concentration of the buffer layer 101 may include determination of the number of layers of the stacked mold structure 110, and extraction of the germanium fraction or concentration of the buffer layer according to the thickness of the number of stacked layers, using the critical thickness graph.

Hereinafter, the disclosure will be described in detail by dividing the process into three steps.

First, the number of stacked layers of the stacked mold structure 110 is determined (S100).

When the target number of stacked layers of the stacked mold structure 110 is determined, the thickness of the target stacked mold structure 110 may be determined. Therefore, a graph having a critical thickness capable of accommodating the thickness of the above-mentioned target stacked mold structure 110 may be selected through FIG. 15. That is to say, a graph in which the critical thickness of the peak is higher than the thickness of the target stacked mold structure 110 may be selected.

Second, the germanium fraction or concentration of the possible buffer layer 101 is extracted, using the critical thickness graph of FIG. 15 (S200).

There may be a plurality of graphs selected in the process of the first step. Therefore, the germanium fraction or concentration of the buffer layer 101 may be extracted in a range. Among them, a specific numerical value may be selected for the germanium fraction or concentration of the buffer layer 101.

Third, the germanium fraction or concentration of the sacrificial layers 121 and 123 is determined, using the germanium fraction or concentration of the buffer layer 101 (S300).

When the buffer layer 101 having a particular germanium fraction or concentration is defined, the shape of the graph may be determined. The germanium concentration of the sacrificial layers 121 and 123 may be determined accordingly. The germanium concentration of the sacrificial layers 121 and 123 is selected so that the critical thickness is higher than the thickness of the above-mentioned target stacked mold structure 110.

Preferably, the stacked mold structure 110 may be stacked at the maximum when the critical thickness is the highest value in each graph of FIG. 15.

As an example, the graph (a) in FIG. 15 may be selected when the germanium concentration of the buffer layer 101 is selected to 3%. At this time, the germanium concentration of the sacrificial layers 121 and 123 is selected to 12%, and the stacked mold structure 110 may be stacked at the maximum.

As another example, the graph (b) in FIG. 15 may be selected when the germanium concentration of the buffer layer 101 is selected to 3.65%. At this time, the germanium concentration of the sacrificial layers 121 and 123 is selected to about 15%, and the stacked mold structure 110 may be stacked at the maximum.

As another example, the graph (c) in FIG. 15 may be selected when the germanium concentration of the buffer layer 101 is selected to 5%. At this time, the germanium concentration of the sacrificial layers 121 and 123 is selected to about 20%, and the stacked mold structure 110 may be stacked at the maximum.

As another example, the graph (d) in FIG. 15 may be selected when the germanium concentration of the buffer layer 101 is selected to 6%. At this time, the germanium concentration of the sacrificial layers 121 and 123 is selected to about 25%, and the stacked mold structure 110 may be stacked at the maximum.

As another example, the graph (e) in FIG. 15 may be selected when the germanium concentration of the buffer layer 101 is selected to 10%. At this time, the germanium concentration of the sacrificial layers 121 and 123 is selected to about 42%, and the stacked mold structure 110 may be stacked at the maximum.

Therefore, when the germanium fraction or concentration of the buffer layer 10 is 3% or more and 3.65% or less, the germanium fraction or concentration of the sacrificial layer 121 and 123 may be 10% or more and 15% or less.

When the germanium fraction or concentration of the buffer layer 10 is 3.65% or more and 5% or less, the germanium fraction or concentration of the sacrificial layer 121 and 123 may be 15% or more and 20% or less.

When the germanium fraction or concentration of the buffer layer 10 is 5% or more and 6% or less, the germanium fraction or concentration of the sacrificial layer 121 and 123 may be 20% or more and 25% or less.

When the germanium fraction or concentration of the buffer layer 10 is 6% or more and 10% or less, the germanium fraction or concentration of the sacrificial layer 121 and 123 may be 25% or more and 45% or less.

In the method for manufacturing a semiconductor device according to some embodiments of the present disclosure, the order of determining the germanium fraction or concentration of the buffer layer 10 and the sacrificial layer 121 and 123 is only an example, and the technical idea of the present disclosure is not limited thereto. For example, after the germanium fraction or concentration of the sacrificial layer 121 and 123 is determined, the germanium fraction or concentration of the buffer layer 10 may be determined.

In concluding the detailed description, those skilled in the art will appreciate that many variations and modifications may be made to the preferred embodiments without substantially departing from the principles of the present invention. Therefore, the disclosed embodiments of the invention are used in a generic and descriptive sense only and not for purposes of limitation.

What is claimed is:

1. A method for manufacturing a semiconductor device, the method comprising:
   providing a first substrate comprising a buffer layer and a base substrate;
   forming a stacked mold structure comprising a plurality of unit laminates on the buffer layer, each of the unit laminates comprising a first sacrificial layer, a first silicon layer, a second sacrificial layer, and a second silicon layer sequentially stacked in a vertical direction; and
   replacing the stacked mold structure with a stacked memory structure,
   wherein the stacked memory structure comprises a metal pattern which replaces the first sacrificial layer and the second sacrificial layer, and an insulating pattern which replaces the second silicon layer,
   the buffer layer comprises silicon-germanium, and
   a germanium concentration of the buffer layer varies depending on a germanium concentration of the first sacrificial layer and a germanium concentration of the second sacrificial layer.

2. The method for manufacturing the semiconductor device of claim 1, wherein the first sacrificial layer and the second sacrificial layer comprise silicon-germanium.

3. The method for manufacturing the semiconductor device of claim 2, wherein the germanium concentration of the first sacrificial layer and the germanium concentration of the second sacrificial layer are each 10% or more and 45% or less.

4. The method for manufacturing the semiconductor device of claim 3, wherein, when the germanium concentration of the buffer layer is 3% or more and 3.65% or less, the germanium concentration of the first sacrificial layer and the germanium concentration of the second sacrificial layer are each 10% or more and 15% or less.

5. The method for manufacturing the semiconductor device of claim 3, wherein, when the germanium concentration of the buffer layer is 3.65% or more and 5% or less, the germanium concentration of the first sacrificial layer and the germanium concentration of the second sacrificial layer are each 15% or more and 20% or less.

6. The method for manufacturing the semiconductor device of claim 3, wherein, when the germanium concentration of the buffer layer is 5% or more and 6% or less, the germanium concentration of the first sacrificial layer and the germanium concentration of the second sacrificial layer are each 20% or more and 25% or less.

7. The method for manufacturing the semiconductor device of claim 3, wherein, when the germanium concentration of the buffer layer is 6% or more and 10% or less, the germanium concentration of the first sacrificial layer and the germanium concentration of the second sacrificial layer are each 25% or more and 45% or less.

8. The method for manufacturing the semiconductor device of claim 2, wherein the germanium concentration of the first sacrificial layer is equal to the germanium concentration of the second sacrificial layer.

9. The method for manufacturing the semiconductor device of claim 1, further comprising:
   forming a bit line which is connected to a first side of the first silicon layer and extends in a first direction perpendicular to an upper surface of the base substrate; and
   forming an information storage element connected to an opposite second side of the first silicon layer, wherein the information storage element comprises a lower electrode, a capacitor dielectric film, and an upper electrode.

10. The method for manufacturing the semiconductor device of claim 9, further comprising:
    forming a silicide pattern along a boundary between the information storage element and the second side of the first silicon layer.

11. The method for manufacturing the semiconductor device of claim 9, wherein the metal pattern comprises an upper metal pattern on a first surface of the first silicon layer, and a lower metal pattern on a second surface opposite to the first surface of the first silicon layer.

12. The method for manufacturing the semiconductor device of claim 9, wherein the insulating pattern protrudes from the second side of the first silicon layer in a second direction intersecting the first direction, and
    the information storage element is between adjacent insulating patterns.

13. The method for manufacturing the semiconductor device of claim 1, wherein a height of the stacked mold structure along the vertical direction is 7 μm to 76 μm.

14. A method for manufacturing a semiconductor device, the method comprising:
    providing a first substrate comprising a buffer layer and a base substrate;
    forming a stacked mold structure comprising a plurality of unit laminates on the buffer layer, each of the unit laminates comprising a first sacrificial layer, a first silicon layer, a second sacrificial layer, and a second silicon layer sequentially stacked in a vertical direction;
    replacing the stacked mold structure with a stacked memory structure;
    forming a peripheral element structure on a second substrate; and
    bonding the first substrate and the second substrate so that the peripheral element structure and the stacked memory structure face each other,
    wherein the buffer layer comprises silicon-germanium, and
    a germanium concentration of the buffer layer varies depending on a germanium concentration of the first sacrificial layer and a germanium concentration of the second sacrificial layer.

15. The method for manufacturing the semiconductor device of claim 14, wherein the first sacrificial layer and the second sacrificial layer comprise silicon-germanium, and
    the germanium concentration of the first sacrificial layer and the germanium concentration of the second sacrificial layer are each 10% or more and 45% or less.

16. The method for manufacturing the semiconductor device of claim 15, wherein, when the germanium concentration of the buffer layer is 3% or more and 3.65% or less, the germanium concentration of the first sacrificial layer and the germanium concentration of the second sacrificial layer are each 10% or more and 15% or less.

17. The method for manufacturing the semiconductor device of claim 15, wherein, when the germanium concentration of the buffer layer is 3.65% or more and 5% or less, the germanium concentration of the first sacrificial layer and the germanium concentration of the second sacrificial layer are each 15% or more and 20% or less.

18. The method for manufacturing the semiconductor device of claim 15, wherein, when the germanium concentration of the buffer layer is 5% or more and 6% or less, the germanium concentration of the first sacrificial layer and the germanium concentration of the second sacrificial layer are each 20% or more and 25% or less.

19. The method for manufacturing the semiconductor device of claim 15, wherein, when the germanium concentration of the buffer layer is 6% or more and 10% or less, the germanium concentration of the first sacrificial layer and the germanium concentration of the second sacrificial layer are each 25% or more and 45% or less.

20. A method for manufacturing a semiconductor device, the method comprising:
   providing a first substrate comprising a buffer layer and a base substrate;
   forming a stacked mold structure comprising a plurality of unit laminates on the buffer layer,
   wherein each of the unit laminates comprises a first sacrificial layer, a first silicon layer, a second sacrificial layer, and a second silicon layer sequentially stacked in a vertical direction,
   wherein each of the buffer layer, the first sacrificial layer and the second sacrificial layer comprises silicon-germanium;
   determining a germanium concentration of the buffer layer by determining a number of stacked layers of the stacked mold structure, and selecting the germanium concentration of the buffer layer according to a thickness of the number of stacked layers, using a critical thickness graph; and
   determining a germanium concentration of the first sacrificial layer and a germanium concentration of the second sacrificial layer using the germanium concentration of the buffer layer.

* * * * *